Dec. 10, 1968 A. J. JORGENSEN 3,416,043

INTEGRATED ANTI-RINGING CLAMPED LOGIC CIRCUITS

Filed April 12, 1965 3 Sheets-Sheet 1

INVENTOR.
ARNOLD J. JORGENSEN
BY
Christie, Parker & Hale
ATTORNEYS.

INTEGRATED ANTI-RINGING CLAMPED LOGIC CIRCUITS

Filed April 12, 1965 3 Sheets-Sheet 2

INVENTOR.
ARNOLD J. JORGENSEN
BY
Christie, Parker & Hale
ATTORNEYS.

INTEGRATED ANTI-RINGING CLAMPED LOGIC CIRCUITS

Filed April 12, 1965 3 Sheets-Sheet 3

INVENTOR.
ARNOLD J. JORGENSEN
BY
Christie, Parker & Hale
ATTORNEYS.

United States Patent Office 3,416,043

Patented Dec. 10, 1968

3,416,043
INTEGRATED ANTI-RINGING CLAMPED LOGIC CIRCUITS

Arnold J. Jorgensen, Duarte, Calif., assignor to Burroughs Corporation, Detroit, Mich., a corporation of Michigan Filed Apr. 12, 1965, Ser. No. 447,426
16 Claims. (Cl. 317—234)

ABSTRACT OF THE DISCLOSURE

An integrated circuit having a logic circuit formed on a single wafer of semiconductor material and having a clamping circuit formed on the same wafer and connected to each input terminal of the logic circuit. The clamping circuit prevents input signals applied to the terminals from exceeding a predetermined value of potential and thereby substantially reduces the problem of "ringing" which otherwise occurs during high speed operation of the logic circuit.

This invention relates to integrated electrical circuits and, more particularly, to integrated transistor logic circuits.

The advances which have been made in the development of integrated device technology now permit a circuit designer to utilize integrated circuits for the performance of logic functions in digital circuitry. The circuit elements of such integrated logic circuits are formed on a single silicon wafer. A general description of such circuits may be found, for example, in a paper by Dr. Robert B. Seeds, entitled, "Integrated Complementary Transistor Logic Gates," published in 1963 by the Western Electronic Show and Convention.

Integrated transistor logic circuits designed for very high-speed, low-cost commercial systems applications and which appear to be particularly advantageous in large digital systems are commercially available from the Fairchild Semiconductor Division of Fairchild Camera and Instrument Corporation. Such circuits have been designed to permit use of open transmission lines of 12 to 15 inches and to maintain operations in the 5 nanosecond speed range while being used in systems employing binary counting rates of which 30 megacycles would be typical. These circuits are described, for example, in a Product Sales Guide entitled "Fairchild CTμL Complementary Transistor Micrologic," published by Fairfield Semiconductor in January 1965.

A serious problem has arisen, however, in the use of such integrated logic circuits. If two static voltage levels, representative respectively of two logic conditions of associated circuitry, are applied via transmission lines to input terminals of such an integrated circuit, it is of course essential that each input signal applied to a terminal be clearly distinguishable throughout its entire duration as being representative of a particular one of the logic conditions. Fluctuations in the value of an input signal applied to a terminal which are extreme enough to encompass both static logic levels must be prevented. Even lesser fluctuations in the input signals applied to the logic circuits may create a serious problem. Thus, for example, where an input signal is applied to a transistor employed in an emitter follower configuration, any fluctuations in the input signal may be transmitted through the entire logic circuit and be reflected in the output of the circuit. Additionally, where a number of such circuits are cascaded with the output of one being utilized as the input of the next, fluctuations occurring at each stage will be compounded as the number of cascaded stages increases.

Unfortunately, it has been found that such fluctuations do occur in the input signals applied to the integrated logic circuits described above. A phenomenon generally known as "ringing" has been found to occur wherein even a perfectly steady voltage level applied from the output of a driving unit to one end of a transmission line will have fluctuations imposed thereon when applied to the logic circuit via the other end of the transmission line. It has been determined that the "ringing" is primarily due to both distributed and lumped capacitance and inductance of the transmission line. The fluctuations arise as energy is transferred back and forth between the inductance and capacitance of the line.

An advantage of the present invention is that it substantially reduces the fluctuations occurring in the input signals applied to integrated transistor logic circuits.

Another advantage of the present invention is that it provides an economical means for substantially reducing such fluctuations.

Another advantage of the present invention is that it provides a means for substantially reducing such fluctuations without requiring the addition of any additional components exterior to the integrated logic circuit thereby providing for ease of assembly and maintaining the space saving advantages of integrated circuits.

Another advantage of the present invention is the provision of improved integrated transistor logic circuits.

The above and other advantages of the present invention are achieved by means of integrated transistor logic circuits in which means for substantially reducing the above described fluctuations are incorporated within the integrated circuits themselves.

As stated above, the fluctuations present in the input signals to the above described integrated circuits arise as a result of the transfer of energy back and forth between the distributed and lumped inductance and capacitance of a transmission line utilized for the transmission of such signals and the circuit elements which it interconnects. Such bidirectional fluctuations about a norm may be reduced to acceptable levels by the prevention of departures in only one direction. Similarly, the swinging of a pendulum to the right and left of center may be eliminated by the prevention of swings in only one direction. In the present invention the fluctuations are greatly reduced by eliminating any fluctuation above a predetermined voltage level. By eliminating or minimizing positive fluctuations about the predetermined level, negative fluctuations are also greatly reduced.

In the present invention, such elimination of fluctuations above a predetermined voltage level is achieved by means of a clamping device. Advantageously, the clamping device may comprise a single multi-emitter transistor formed within the integrated circuit itself. The number of emitters may be made equal to the number of input terminals of the particular logic circuit with which the transistor is associated.

Another advantage of the present invention is that use of such a multi-emitter transistor requires much less power than would other means by which clamping could be achieved. Additionally, by requiring less power than such other clamping means, it is not likely to shorten the life expectancy of an output transistor of a driver unit supplying input signals to the integrated circuit.

The manner of operation of the present invention and the manner in which it achieves the above and other advantages may be more clearly understood by reference to the following detailed description when considered with the drawing, in which.

Figure 1:
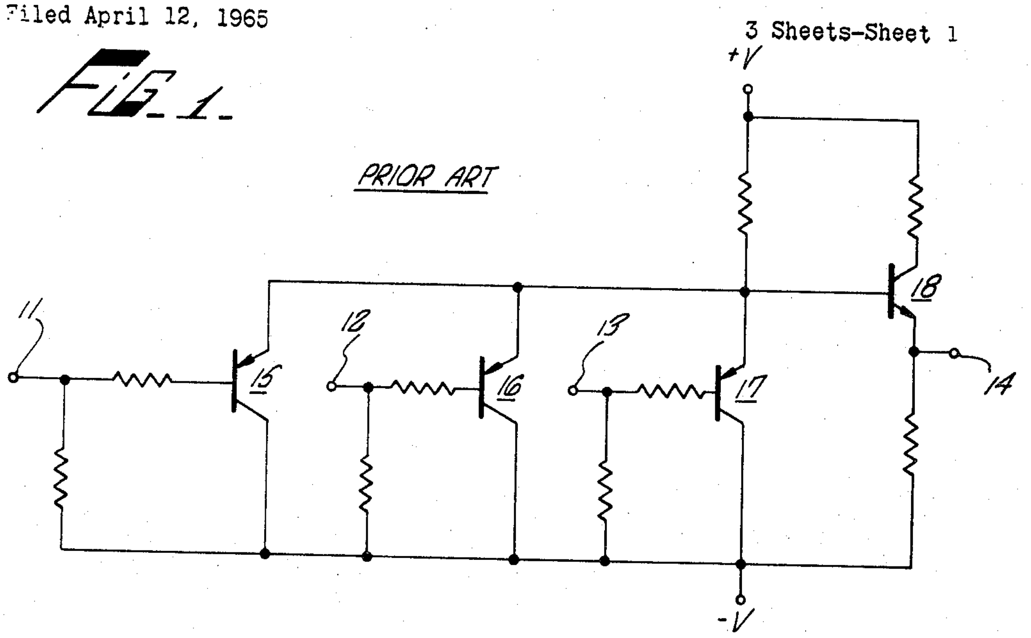
FIG. 1 depicts a typical AND gate presently available in integrated circuit form.
Figure 7:
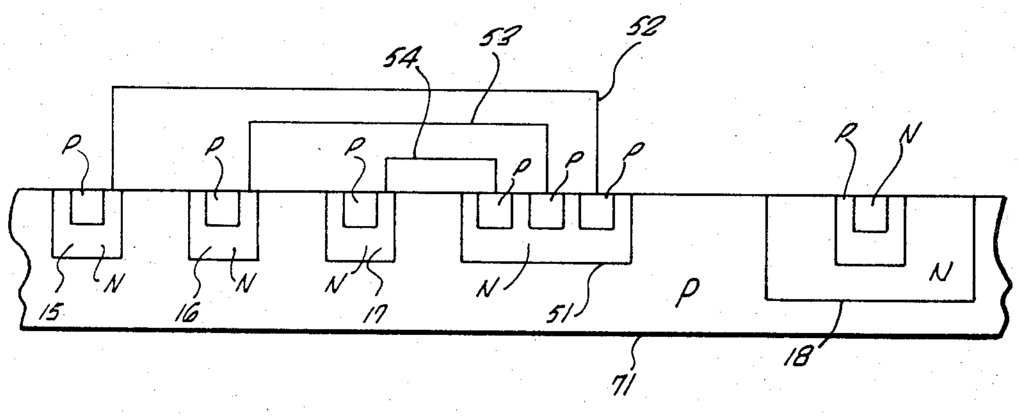
Figure 6:
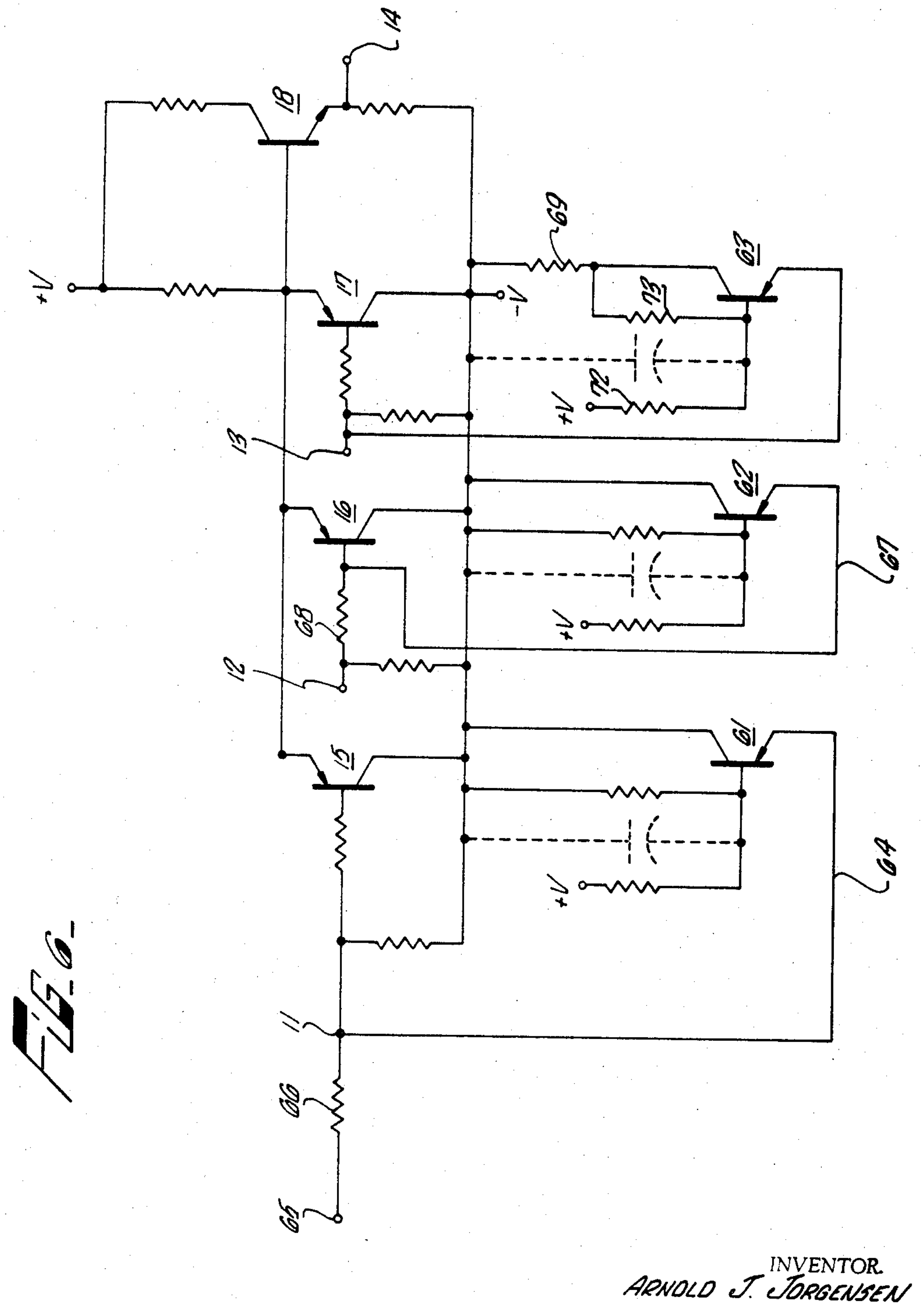

FIG. 6 depicts an AND gate, identical to that shown in FIG. 1, in which the input signals applied to all of its input transistors are clamped by alternative transistor clamping means; and FIG. 7 depicts a schematic representation of an integrated transistor logic circuit in which the logic circuit and a multi-emitter transistor, used to clamp each input transistor of the logic circuit, are formed upon the same silicon wafer.

FIG. 1 depicts a typical AND gate presently available in integrated circuit form. The gate has three input terminals 11, 12, and 13, and an output terminal 14. Three PNP input transistors 15, 16, and 17 are associated, respectively, with input terminals 11, 12, and 13. An NPN output transistor 18 is associated with output terminal 14. Each of these transistors is employed in an emitter follower configuration wherein the potential appearing at the emitter of each of the transistors normally approaches very closely the potential applied to its base. The voltage appearing at output terminal 14 is very nearly equal to whichever of the input terminals 11, 12, and 13 has the lowest voltage applied thereto. Thus, if two static voltage levels representative, respectively, of two logic conditions of associated circuitry, are applied to the input terminals 11, 12, and 13, the lower of the two static voltage levels will appear at output terminal 14 unless the higher voltage level is applied to all three of the input terminals 11, 12, and 13. Thus, in operation, the AND gate of FIG. 1 provides a high voltage level at output terminal 14 only when the high voltage level is applied to all three of the input terminals 11, 12, and 13.

The AND gate shown in FIG. 1 and other similar transistor logic circuits are currently available in integrated circuit form wherein an entire circuit is formed upon a single wafer of silicon. Such circuits are designed for use in digital systems employing binary counting rates in the order of 30 megacycles. Leads applying input signals to the input terminals of these logic circuits are of the order of 12 inches in length and may apply input signals from other similar integrated logic circuits or by other driving circuits. At the frequencies employed, such leads act like transmission lines, together with lumped constants, and it has been found that a phenomenon generally known as "ringing" often interferes with the proper transmission of input signals to the integrated logic circuits. As a result of this phenomenon, fluctuations are imposed upon the static voltage level input signal applied to the integrated logic circuits.

Figure 2:
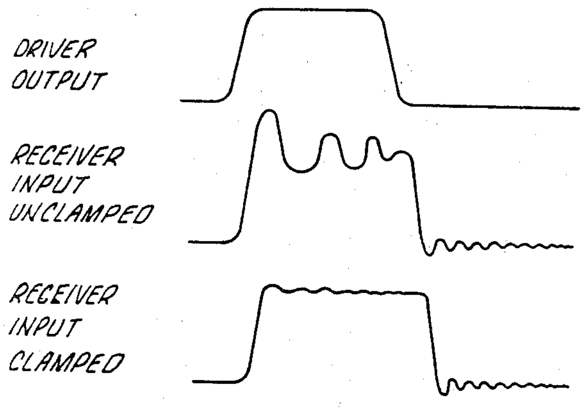
FIG. 2 depicts waveforms illustrative of the effect upon pulses generated by a driving circuit, and subsequently applied to an input terminal of the circuit of FIG. 1 via a transmission line, which may be achieved by means of a clamping means connected to the input terminal.

FIG. 2 depicts waveforms which illustrate the phenomenon of "ringing." The first pulse shown in FIG. 2 depicts an output pulse provided by a driving circuit which generates output signals which are to be applied to an input terminal of an integrated logic circuit. The pulse shown in FIG. 2 as being generated by the driving circuit is of the higher of two static voltage levels representative of logic conditions of associated circuitry. Although a sharp pulse is generated by the driving circuit, the second pulse shown in FIG. 2 illustrates how this pulse may appear when it is applied to the input terminal of a logic circuit by means of a transmission line connected between the driving circuit and the logic circuit. As described previously, such fluctuations as appear in the second pulse shown in FIG. 2 may seriously interfere with the operation of this and succeeding logic circuits. It has been determined that such fluctuations are the result of both distributed and lumped capacitance and inductance within the transmission line. As energy is transferred back and forth between the inductance and capacitance, the fluctuations result. The fluctuations are both above and below the static voltage level being generated by the driving circuit. However, by reducing the fluctuations in one direction from the static level, the fluctuations in the other direction will also be reduced. Fluctuations above the static voltage level may be reduced by clamping the input terminals of the logic circuit at a predetermined voltage level equal to the higher of the two static voltage levels generated by the driving circuit. By clamping the input terminal at this voltage level, fluctuations both above and below this level caused by "ringing" will be greatly reduced as indicated by the third pulse shown in FIG. 2 which represents the input to the logic circuit when the input of that circuit is clamped.

The problem of "ringing" in connection with the lower of the two static voltage levels is minor by comparison with that of the higher level. This results since the lower level output pulse will generally be generated via output resistors while the higher level output pulse will generated via emitter followers. As a result, any "ringing" associated with the lower voltage level will be of at least an order of magnitude less than that associated with the higher voltage level. Such "ringing" at the lower voltage level is indicated in both the second and third pulses shown in FIG. 2.

Figure 3:
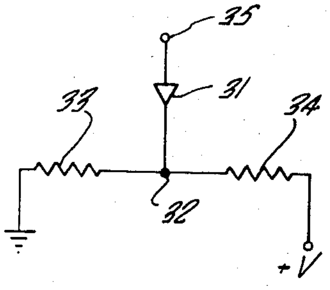
FIG. 3 depicts a diode clamping means utilizable to clamp an input terminal of the circuit of FIG. 1.

FIG. 3 depicts a semiconductor diode clamping means which may be utilized to clamp an input terminal of an integrated logic circuit at a predetermined voltage level. Semiconductor diode 31 has its terminal 32 connected at the junction of voltage divider resistors 33 and 34 which are connected respectively to a source of ground potential and a source of positive potential indicated as +V. Terminal 35 of diode 31 would be connected to an input terminal of an integrated logic circuit. As a result the terminal 35 and, therefore, the input terminal of the logic circuit would never be able to reach a potential higher than that of terminal 32 plus a small potential drop across diode 31. The potential of terminal 32 would be set at a predetermined value as determined by the voltage resistors 33 and 34 and the positive voltage source +V. Use of such a diode clamping means to clamp the input terminals of the logic circuits has several disadvantages, however. If high values of resistance are used for the rsiestors 3 3and 34, the potential established at terminal 32 will tend to float and positive clamping action will not be achieved. If sufficiently low values of resistance are utilized for the resistors 33 and 34, however, a relatively high current will be drawn through diode 31 during a clamping operation and this current may tend to reduce the life expectancy of the diode 31 or of the output transistor of a driving unit supplying input signals to the terminal to which diode 31 is connected.

Figure 4:
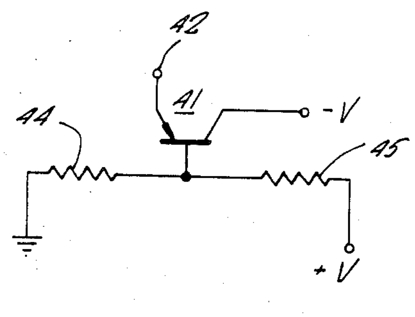
FIG. 4 depicts a transistor clamping means utilizable to clamp an input terminal of the circuit of FIG. 1.

FIG. 4 depicts a preferable means for clamping an input terminal of a logic circuit at a predetermined value of potential. PNP transistor 41 has its emitter connected to terminal 42, its collector connected to a source of negative potential designated as −V, and its base connected to terminal 43 which is the junction of voltage divider resistors 44 and 45. Resistors 44 and 45 are connected between a source of ground potential and a source of positive potential designated as +V, respectively. To achieve a clamping effect, the terminal 42 of the emitter will be connected to an input terminal of the logic circuit. The clamping action will be similar to that described in connection with the diode of FIG. 3 in that the potential established at terminal 43 by the resistors 44 and 45 and source of positive potential +V will be the potential to which the input terminal of the logic circuit will be clamped. Although the operation of the clamping means shown in FIG. 4 is similar to that of the clamping means shown in FIG. 3, it has a major advantage in that the current in the emitter will be ($\beta+1$) times greater than the current in the base. Thus, for example, if $\beta$ is equal to 10, it will be possible to get the same effect of clamping as that achieved in the device shown in FIG. 3, although the resistors 44 and 45 may be made 11 times as large as corresponding resistors 33 and 34. Thus, if in the two circuits the voltage divider resistors are in both cases made great enough to prevent floating of the terminals 32 and 43, the current in the emitter of transistor 41 will be only 1/11 of the value of current in the diode 31. Consequently, less power will be dissipated by the clamping circuit shown in FIG. 4 than by that shown in FIG. 3 and there will be less likelihood that the life expectancy of an output transistor of a driving unit supplying an input signal to the logic circuit will be shortened.

Figure 5:
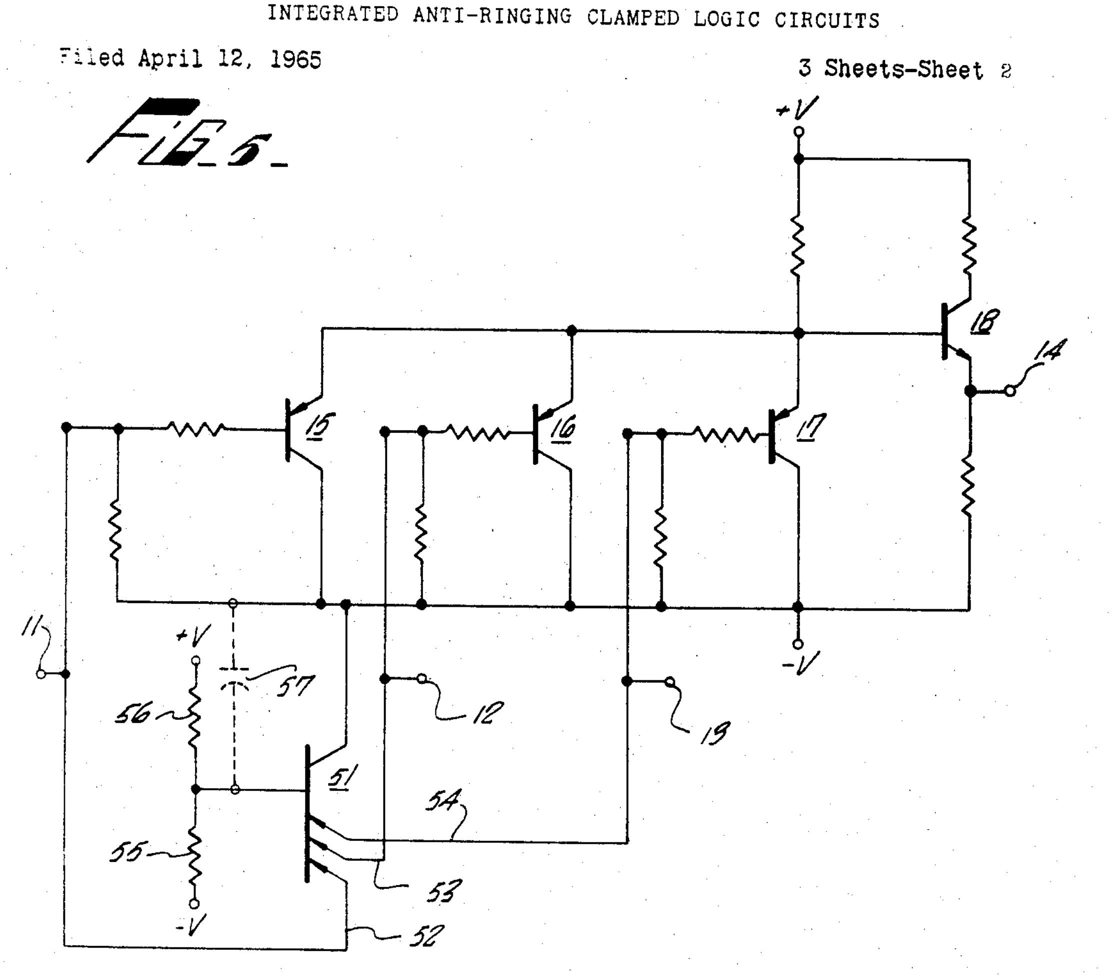
FIG. 5 depicts an AND gate, identical to that shown in FIG. 1, having all of its input terminals clamped by a clamping means which utilizes a single multi-emitter transistor.

FIG. 5 depicts the AND gate of FIG. 1 to which a transistor clamping means has been added. Elements shown in both FIG. 1 and FIG. 5 will bear the same reference characters in both figures.

Transistor 51, shown in FIG. 5, is a multi-emitter transistor having three emitters which are connected to input terminals 11, 12, and 13, by leads 52, 53, and 54, respectively. The base of transistor 51 is connected to the junction of voltage divider resistors 55 and 56, which are connected between a source of negative potential designated —V, and a source of positive potential designated +V, respectively. As previously described, the effect of the transistor clamping means will be to prevent the terminals 11, 12, and 13 from reaching a value of potential greater than that established at the base of transistor 51 by the voltage divider resistors 55 and 56, and the values of potential +V and —V. A virtual capacitor 57, shown connected between the junction of resistors 55 and 56 and the source of negative potential —V, is inherent in the circuit of FIG. 5 and aids the voltage divider resistors in maintaining their junction point at a uniform value of potential. The base of transistor 51 will advantageously be established at a level of potential equal to the higher of the two static voltage levels representative of two logic conditions which are applied by transmission lines to the input terminals 11, 12, and 13. As a result, any fluctuations above this value caused by "ringing" in the transmission line will be eliminated and the general problem of "ringing", as indicated by the pulse forms in FIG. 2 will be greatly diminished.

There remains a danger, however, that the driving unit may provide more power than even transistor 51 can safely handle, with a resulting reduction in the life expectancy of transistor 51 and of the output transistor of the driving unit. This may result, for example, if the output power of pulses generated by the driving unit is not maintained at a controllable level. Alternative transistor clamping means may be utilized, however, wherein such a result is guarded against. Several such alternatives are illustrated in FIG. 6.

FIG. 6 depicts an AND gate, identical to that shown in FIG. 1, in which the input signals applied to its input transistor are clamped by several alternative transistor clamping means. Elements shown in both FIG. 1 and FIG. 6 will bear the same reference character in both figures. FIG. 6 illustrates three alternative transistor clamping means similar to the transistor clamping means discussed in connection with FIG. 5 but which have been modified to guard against overdriving of the clamping means. Transistors 61, 62 and 63 are the active elements of three clamping means associated with transistors 15, 16, and 17, respectively. Three separate clamping transistors, rather than a single multi-emitter transistor, are shown in FIG. 6 since three different alternative transistor clamping means are being illustrated.

The emitter of transistor 61 is connected to terminal 11 by lead 64, just as lead 52 connects an emitter of transistor 51 to terminal 11 in FIG. 5. However, terminal 65 of FIG. 6 is made the input terminal associated with input transistor 15 and an added resistor 66 is connected between terminals 65 and 11. An additional voltage drop will appear across resistor 66 and the value of this resistor may be chosen, in any particular application of the present invention, to prevent the overdriving of transistor 61.

The emitter of transistor 62 is connected by lead 67 directly to the base of transistor 16 rather than to input terminal 12. As a result, the resistor connected between terminal 12 and the base of transistor 16, designated in FIG. 6 as resistor 68, is utilized to prevent overdriving of the transistor 62. Moreover, in the manufacture of devices employing the present invention it may be easier to clamp at this point.

A feedback resistor 69 has been added to the collector circuit of transistor 63 and is connected between the collector and the source of negative potential —V. The base of transistor 63 is connected to the junction of voltage divider resistors 72 and 73 which are connected between the souce of positive potential +V and the collector of transistor 63, respectively. As a result, a negative feedback effect is introduced which may be utilized to prevent the overdriving of transistor 63.

The preceding transistor clamping means are merely illustrative of means by which overdriving of the clamping transistors may be prevented in arrangements wherein the problem of overdriving exists. The values of the resistors 66, 68 and 69 may be chosen for particular applications of the present invention such that overdriving is prevented. Prevention of overdriving diminishes somewhat the clamping action of the clamping means, however. Circuits utilizing the present invention may nevertheless be designed in which satisfactory clamping and the prevention of overdriving are both achieved.

FIG. 7 depicts a schematic representation of an integrated transistor logic circuit in which both the logic circuit and a multi-emitter transistor clamping means are formed upon the same semiconductor wafer. Rather than externally adding such a transistor clamping means to a pre-existing integrated logic circuit such as that shown in FIG. 1, it is highly advantageous to incorporate such a clamping circuit within the same integrated circuit unit. As a result, the addition of extra components exterior to the integrated logic circuit itself is made unnecessary. Ease of assembly is thereby achieved and the space saving advantages possessed by integrated circuits are thereby maintained. Furthermore, the addition of another transistor upon the semiconductor wafer may be achieved relatively inexpensively.

FIG. 7 depicts in schematic form a portion of a P-type silicon wafer 71 which comprises a part of an integrated transistor logic circuit. FIG. 7 indicates schematically how the circuit of FIG. 5 could be incorporated onto a single silicon wafer. Input transistors 15, 16, and 17, shown in FIGS. 1 and 5, also appear in FIG. 7. Similarly, output transistor 18 shown in FIGS. 1 and 5 is shown in FIG. 7, and multi-emitter transistor 51, shown in FIG. 5, is also shown in FIG. 7. These transistors would be formed upon the silicon wafer 71 according to well-known diffusion techniques.

It may in practice be easier to connect the emitters of transistor 51 to the bases of transistors 15, 16, and 17 rather than to the input terminals 11, 12, and 13. Moreover, such connections directly to the bases would provide the advantages discussed previously in connection with clamping transistor 62 of FIG. 6. The connection between the emitters of transistor 51 and the input transistors 15, 16, and 17, are schematically indicated in FIG. 7 by the leads 52, 53 and 54 shown connected between the emitters and the bases of transistors 15, 16, and 17, respectively.

What have been described are considered to be only illustrative embodiments of the present invention and, accordingly, it is to be understood that various and numerous other arrangements may be devised by one skilled in the art without departing from the spirit and scope of this invention.

What is claimed is:

1. An integrated circuit comprising:

a logic circuit having at least one input terminal; the entire logic circuit being comprised of a plurality of P-type and N-type regions having junctions therebetween diffused in a single body of semiconductor material; and clamping means connected to each of the terminals for preventing input signals applied to the terminals from exceeding a predetermined value of potential;

the clamping means also being comprised of a plurality of P-type and N-type regions having junctions therebetween diffused in the body of semiconductor material.

2. An integrated circuit comprising:

a logic circuit having a plurality of input terminals; the entire logic circuit being comprised of a plurality of P-type and N-type regions having junctions therebetween diffused in a single body of semiconductor material; and clamping means connected to each of the terminals for preventing input signals applied to the terminals from exceeding a predetermined value of potential;

the clamping means also being comprised of a plurality of P-type and N-type regions having junctions therebetween diffused in the body of semiconductor material.

3. An integrated circuit according to claim 2 in which the clamping means comprises a single transistor having a plurality of emitters, the number of emitters being equal to the number of input terminals, each of the emitters being connected to a different one of the input terminals.

4. An integrated circuit comprising:

a logic circuit having at least one input terminal; all of the active elements of the circuit being comprised of a plurality of P-type and N-type regions having junctions therebetween diffused in a single body of semiconductor material; and semiconductor clamping means connected to each of the terminals for preventing input signals applied to the terminals from exceeding a predetermined value of potential;

the semiconductor clamping means also being comprised of a plurality of P-type and N-type regions having junctions therebetween diffused in the body of semiconductor material.

5. An integrated circuit comprising:

a transistor logic circuit having a plurality of input terminals;

all of the transistors of the logic circuit being comprised of a plurality of P-type and N-type regions having junctions therebetween diffused in a single body of semiconductor material; and transistor clamping means connected to each of the terminals for preventing input signals applied to the terminals from exceeding a predetermined value of potential;

the transistor clamping means also being comprised of a plurality of P-type and N-type regions having junctions therebetween diffused in the body of semiconductor material.

6. An integrated circuit comprising:

a transistor logic circuit having a plurality of input terminals;

an input transistor employed in an emitter follower configuration associated with each input terminal;

all of the transistors of the logic circuit being comprised of a plurality of P-type and N-type regions having junctions therebetween diffused in a single body of semiconductor material; and transistor clamping means connected to each of the input transistors for preventing input signals applied to the input transistors via transmission lines from exceeding a predetermined value of potential;

the transistor clamping means also being comprised of a plurality of P-type and N-type regions having junctions therebetween diffused in the body of semiconductor material.

7. An integrated circuit comprising:

a transistor logic circuit having a plurality of input terminals;

a PNP input transistor employed in an emitter follower configuration associated with each input terminal;

all of the transistors of the logic circuit being comprised of a plurality of P-type and N-type regions having junctions therebetween diffused in a single body of semiconductor material; and clamping means connected to each of the input transistors for preventing input signals applied to the input transistors via transmission lines from exceeding a predetermined value of potential;

the clamping means comprising a single PNP transistor also being comprised of a plurality of P-type and N-type regions having junctions therebetween diffused in the body of semiconductor material;

the clamping transistor having a plurality of emitters, the number of emitters being equal to the number of input transistors; and means for connecting each of the emitters of the clamping transistors to the base of a different one of the input transistors.

8. An integrated circuit according to claim 7 in which the prdetermined value of potential is set equal to the higher of two static potential levels representative respectively of two logic conditions of associated circuitry.

9. An integrated circuit comprising:

a transistor AND gate having a plurality of input terminals and an output terminal;

an output transistor associated with the output terminal and an input transistor associated with each of the input terminals;

the output transistor and all of the input transistors being comprised of a plurality of P-type and N-type regions having junctions therebetween diffused in a single body of semiconductor material;

clamping means connected to each of the input transistors for substantially reducing fluctuations appearing in input signals applied to the input transistors via transmission lines and resulting from distributed and lumped capacitance and inductance of the transmission line;

the clamping means comprising a transistor having a plurality of emitters, the transistor also being comprised of a plurality of P-type and N-type regions having junctions therebetween diffused in the body of semiconductor material; and means for connecting each of the emitters of the clamping transistor to a different one of the input transistors.

10. An integrated circuit according to claim 9 in which the output transistor and each of the input transistors are employed in emitter follower configurations.

11. An integrated circuit comprising:

a transistor AND gate having a plurality of input terminals and an output terminal;

a NPN transistor associated with the output terminal and a PNP transistor associated with each of the input terminals;

the output transistor and all of the input transistors being comprised of a plurality of P-type and N-type regions having junctions therebetween diffused in a single body of semiconductor material and being employed in emitter follower configurations; and clamping means connected to each of the input transistors for preventing input signals applied to the input transistors via transmission lines from exceeding a predetermined value of potential;

the clamping means comprising a single PNP transistor also being comprised of a plurality of P-type and N-type regions having junctions therebetween diffused in the body of semiconductor material;
the clamping transistor having a plurality of emitters, the number of emitters being equal to the number of input terminals; and
means for connecting each of the emitters of the clamping transistor to the base of a different one of the input transistors.

12. In a digital data system having a binary counting rate capability greater than 10 megacycles, an integrated circuit comprising:
a transistor logic circuit having at least one input terminal;
all of the transistors of the logic circuit being comprised of a plurality of P-type and N-type regions having junctions therebetween diffused in a single body of semiconductor material; and
semiconductor clamping means connected to each of the terminals for preventing input signals applied to the terminals from exceeding a predetermined value of potential;
the semiconductor clamping means also being comprised of a plurality of P-type and N-type regions having junctions therebetween diffused in the body of semiconductor material.

13. In a digital data system having a binary counting rate capability greater than 10 megacycles, an integrated circuit according to claim 12 in which each of the transistors of the logic circuit is employed in an emitter follower configuration.

14. In a digital data system having a binary counting rate capability greater than 10 megacycles, an integrated circuit compirsing:
a transistor logic circuit having a plurality of input terminals;
a PNP input transistor employed in an emitter follower configuration associated with each input terminal;
all of the transistors of the logic circuit being comprised of a plurality of P-type and N-type regions having junctions therebetween diffused in a single body of semiconductor material; and
clamping means connected to each of the input transistors for preventing signals applied to the input transistors from exceeding a predetermined value of potential;
the clamping means comprising a single PNP transistor also comprised of a plurality of P-type and N-type regions having junctions therebetween diffused in the body of semiconductor material;
the clamping transistor having a plurality of emitters, the number of emitters being equal to the number of input terminals; and
means connecting each of the emitters of the clamping transistor to the base of a different one of the input transistors.

15. In a digital data system having a binary counting rate capability greater than 10 megacycles, an integrated circuit comprising:
a transistor AND gate having a plurality of input terminals and an output terminal;
a NPN transistor associated with the output terminal and a PNP transistor associated with each of the input terminals;
the output transistor and all of the input transistors being comprised of a plurality of P-type and N-type regions having junctions therebetween diffused in a single body of semiconductor material and being employed in emitter follower configurations; and
clamping means connected to each of the input transistors for preventing signals applied to the input transistors from exceeding a predetermined value of potential;
the clamping means comprising a single PNP transistor also being comprised of a plurality of P-type and N-type regions having junctions therebetween diffused in the body of semiconductor material;
the clamping transistor having a plurality of emitters, the number of emitters being equal to the number of input terminals; and
means for connecting each of the emitters of the clamping transistor to the base of a different one of the input transistors.

16. An integrated circuit comprising:
a transistor logic circuit having a plurality of input terminals;
an input transistor associated iwth each input terminal;
all of the transistors of the logic circuit being comprised of a plurality of P-type and N-type regions having junctions therebetween diffused in a single body of semiconductor material; and
transistor clamping means connected to each of the input transistors for preventing input signals applied to the input transistors from exceeding a predetermined value of potential;
the transistor clamping means also being comprised of a plurality of P-type and N-type regions having junctions therebetween diffused in the body of semiconductor material.

References Cited

UNITED STATES PATENTS

| | | | |
|---|---|---|---|
| 2,978,594 | 4/1961 | Walker | 307—88.5 |
| 3,070,762 | 12/1962 | Evans | 333—70 |
| 3,229,119 | 1/1966 | Bohn et al. | 307—88.5 |
| 3,256,587 | 6/1966 | Hangstefer | 29—155.5 |
| 3,275,846 | 9/1966 | Bailey | 307—88.5 |

JOHN W. HUCKERT, *Primary Examiner.*

R. F. SANDLER, *Assistant Examiner.*

U.S. Cl. X.R.

317—235; 307—213, 218, 237, 303